United States Patent
Ikisawa et al.

(10) Patent No.: US 8,252,206 B2
(45) Date of Patent: Aug. 28, 2012

(54) AMORPHOUS FILM OF COMPOSITE OXIDE, CRYSTALLINE FILM OF COMPOSITE OXIDE, METHOD OF PRODUCING SAID FILMS AND SINTERED COMPACT OF COMPOSITE OXIDE

(75) Inventors: Masakatsu Ikisawa, Ibaraki (JP); Masataka Yahagi, Ibaraki (JP); Kozo Osada, Ibaraki (JP); Takashi Kakeno, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 381 days.

(21) Appl. No.: 12/666,306

(22) PCT Filed: Jun. 13, 2008

(86) PCT No.: PCT/JP2008/060861
§ 371 (c)(1),
(2), (4) Date: Dec. 28, 2009

(87) PCT Pub. No.: WO2009/001693
PCT Pub. Date: Dec. 31, 2008

(65) Prior Publication Data
US 2010/0189636 A1   Jul. 29, 2010

(30) Foreign Application Priority Data

Jun. 26, 2007   (JP) ................................ 2007-167961

(51) Int. Cl.
*H01B 1/08* (2006.01)
(52) U.S. Cl. ................................ 252/520.1; 204/192.15
(58) Field of Classification Search ............... 252/518.1, 252/520.1; 204/192.15
See application file for complete search history.

(56) References Cited

U.S. PATENT DOCUMENTS

| 6,106,681 A | 8/2000 | Saito et al. |
| 6,929,772 B2 | 8/2005 | Yanai et al. |
| 7,008,519 B2 | 3/2006 | Takahashi et al. |
| 7,504,351 B2 | 3/2009 | Kurihara |
| 2008/0173962 A1 | 7/2008 | Jeong et al. |
| 2009/0085014 A1 | 4/2009 | Ikisawa et al. |
| 2009/0120786 A1 | 5/2009 | Osada |
| 2009/0200525 A1 | 8/2009 | Ikisawa et al. |
| 2009/0206303 A1 | 8/2009 | Osada |
| 2009/0250669 A1 | 10/2009 | Osada |
| 2010/0140570 A1 | 6/2010 | Ikisawa et al. |
| 2012/0043509 A1 | 2/2012 | Takami et al. |

FOREIGN PATENT DOCUMENTS
JP   09-110527 A   4/1997
(Continued)

*Primary Examiner* — Mark Kopec
(74) *Attorney, Agent, or Firm* — Howson & Howson LLP (57) ABSTRACT

Provided is an amorphous film comprised substantially of indium, tin, magnesium and oxygen, and containing tin at a ratio of 5 to 15% based on an atomicity ratio of Sn/(In+Sn+Mg) and magnesium at a ratio of 0.1 to 2.0% based on an atomicity ratio of Mg/(In+Sn+Mg) with remnant being indium and oxygen, and having a film resistivity of 0.4 mΩcm or less as a result of crystallizing the film by annealing the film at a temperature of 260° C. or lower. An amorphous ITO thin film for use as a display electrode and the like in flat panel displays is obtained by way of sputter deposition without heating the substrate and without the need of adding water during the deposition. This amorphous ITO film has the property of being crystallized by annealing at 260° C. or lower, which is not such a high temperature, and having low resistivity after crystallization. Also provided are a method of producing the film and a sintered compact for producing the film.

5 Claims, 2 Drawing Sheets

FOREIGN PATENT DOCUMENTS

| | | |
|---|---|---|
| JP | 2001-151572 A | 6/2001 |
| JP | 2003-055759 A | 2/2003 |
| JP | 2003-105532 A | 4/2003 |
| JP | 2003-160861 A | 6/2003 |
| JP | 3632524 B2 | 3/2005 |
| JP | 2005-194594 A | 7/2005 |
| JP | 2005-259497 A | 9/2005 |
| JP | 3827334 B2 | 9/2006 |

AMORPHOUS FILM OF COMPOSITE OXIDE, CRYSTALLINE FILM OF COMPOSITE OXIDE, METHOD OF PRODUCING SAID FILMS AND SINTERED COMPACT OF COMPOSITE OXIDE

BACKGROUND OF THE INVENTION

The present invention relates to an amorphous film of composite oxide and a crystalline film of composite oxide for use as a transparent conductive film to be formed as an electrode in flat panel displays and the like, as well as to a method of producing an amorphous film of composite oxide, a method of producing a crystalline film of composite oxide, and a sintered compact of composite oxide.

An ITO (Indium Tin Oxide) film is characterized in low resistivity and high transmission factor, and can be microfabricated easily. Since these characteristics are superior in comparison to other transparent conductive films, an ITO film is being broadly used in various fields including for display electrode in a flat panel display. The deposition method of the ITO film in today's industrial production process is mostly based on the so-called sputter deposition method of performing sputtering using an ITO sintered compact as the target since the ITO film can be uniformly formed on a large area with favorable productivity.

In a flat panel display manufacture process using an ITO transparent conductive film, the crystallinity of the ITO film immediately after the sputtering is amorphous, and, in most cases, microfabrication such as etching is performed with the ITO film in an amorphous state, and thermal annealing is subsequently performed in order to crystallize the ITO film. This is because an ITO amorphous film is advantageous in terms of productivity in a large etching rate, and the ITO crystal film is superior in low resistivity and in heat resistance, and both advantages can thereby be enjoyed.

Although most of the film obtained by sputtering the ITO target is amorphous, a part of the film becomes crystallized. The reason for this is that some particles that adhere to the substrate due to sputtering have a high energy level, the temperature of the film becomes so high as to exceed the crystallization temperature due to the transfer of energy after the particles adhere to the substrate, and a part of the film consequently becomes crystallized although the crystallization temperature of the ITO film is approximately 150° C. and most of the film is amorphous since it will be at a temperature that is lower than 150° C.

If a part of the ITO film becomes crystallized as described above, such crystallized portion will remain as so-called etching residue during the subsequent etching process, and cause problems such as a short circuit, since the etching rate of that part will be lower than the etching rate of an amorphous portion by roughly double digits.

In light of the above, it is known that adding water ($H_2O$) in addition to the sputter gas such as argon in the chamber during the sputtering process is effective as a method of prevention of the crystallization of the film and amorphisizing the entire film (for instance, refer to Non-Patent Document 1).

Nevertheless, the method of attempting to obtain an amorphous film by way of sputtering upon adding water entails numerous problems. Foremost, in many cases particles are generated on the film. These particles have bad influence on the flatness and crystallinity of the sputtered film. Since particles will not be generated if water is not added, the problem of generation of particles is caused by the adding water.

In addition, the concentration will gradually fall below the adequate concentration, and a part of the film will become crystallized since the water concentration in the sputtering chamber gradually decreases pursuant to the lapse of the sputtering time, even if it is initially an adequate water concentration.

On the other hand, however, if the concentration of the water to be added is increased in order to reliably obtain an amorphous film, the crystallization temperature upon crystallizing the film in the subsequent annealing process will become extremely high, which is a problem in that the resistivity of the obtained film will become extremely high.

In other words, if sputtering is performed upon adding water to amorphize the entire sputtered film, it is necessary to constantly monitor and control the water concentration within the chamber, however, this is extremely difficult and requires considerable time and effort.

To overcome the foregoing problems, a transparent conductive material as a stable amorphous material is sometimes used in substitute for an ITO film in that a crystalline film can be easily formed. For instance, with a sintered compact having a composition of adding zinc to indium oxide as the target, it is known that such a target can be sputtered to obtain an amorphous film, but the sputtered film obtained as described above is an extremely stable amorphous material and will not crystallize unless it is subject to a high temperature of 500° C. or higher.

Thus, it is not possible to attain the advantages in the production process of crystallizing the film and incomparably reducing the etching rate, and the resistivity of the film will be approximately 0.45 mΩcm, which is higher than the crystallized ITO film. Moreover, the visible light average transmission factor of this film is roughly 85%, and is inferior to an ITO film.

Also, there are the following patent documents and the like that are similar to the present invention in certain respects as a matter of form but different based on configuration and technical concept, and the outline thereof is explained below.

Patent Document 1 (Japanese Laid-Open Patent Publication No. 2003-105532) aims to achieve a high resistivity film for use in touch panels and the like, and describes a sputtering target in that nonconductive oxide is added to ITO as the means for achieving the foregoing object.

Although magnesium oxide and the like are described in the claims as examples of the nonconductive oxide, the Examples only describe silicon oxide as the nonconductive oxide. In addition, Patent Document 1 fails to provide any description regarding the crystallinity of the film during deposition and the crystallization of the film by way of subsequent annealing, and the film resistivity is extremely high at roughly 0.8 to $10\times10^{-3}$ Ωcm, the technical concept and range differ from the present invention.

Patent Document 2 (Japanese Patent No. 3215392) aims to obtain an amorphous film that is superior in flatness and heat resistance even at a temperature that is higher than the crystallization temperature of ITO, and realizes an amorphous film even at a substrate temperature of 200° C. by increasing the additive concentration of magnesium (2.4% or more) as the means for achieving the foregoing object. However, since the magnesium concentration is high, the film resistivity is also high (based on the results of Example 1, the film resistivity is $7.9\times10^{-4}$ Ωcm), and the film of Patent Document 2 has inferior characteristics as a transparent conductive film in comparison to the present invention.

Accordingly, Patent Document 2 differs from the present invention in that its technical concept does not aim to control the crystallinity or lower the resistivity of the crystallized film, and the concentration of the added magnesium is also high.

Patent Document 3 (Japanese Patent No. 3827334) aims to increase the density of the oxide sintered compact, and describes an ITO sintered compact containing 5 to 5000 ppm of one or more types of elements selected from five types of elements such as magnesium and the like in the ITO, and which satisfies various other conditions as the means for achieving the foregoing object. However, Patent Document 3 only relates to the characteristics of a sintered compact, and fails to provide any description concerning the definition or improvement of the film characteristics.

Patent Document 3 vaguely describes only the specific resistance of the film obtained by sputtering the foregoing sintered compact in the Examples, and merely shows that the specific resistance is slightly lower than film obtained from a standard ITO to which prescribed elements are not added.

Moreover, no correlation between the substrate temperature and the film resistivity can be acknowledged, and the film resistivity is still low even at 100° C. Thus, it is assumed that the film is crystallized. In other words, Patent Document 3 fails to provide any knowledge regarding the film crystallinity and the like, and the technical concept and range are different from the present invention.

Patent Document 5 (Japanese Patent No. 3632524), Patent Document 6 (Japanese Laid-Open Patent Publication No. 2003-055759), and Patent Document 7 (Japanese Laid-Open Patent Publication No. 2003-160861) describe a target in that magnesium in a prescribed concentration range is added to the ITO, and respectively describe magnesium oxide, magnesium carbonate, and magnesium indium as the magnesium raw material. However, Patent Document 5, Patent Document 6 and Patent Document 7 relate to methods of producing a target inexpensively, without cracks, and without arcing during the sputtering process in order to form a film having characteristics such as high resistivity and flatness for use in touch panels and the like, and fail to include any technical concept concerning characteristics such as the film crystallinity and film resistivity of the present invention, and the range is also different.

[Non-Patent Document 1] Thin Solid Films 445 (2003) p235 to 240
[Patent Document 1] Japanese Patent Laid-Open Publication No. 2003-105532
[Patent Document 2] Papanese Patent No. 3215392
[Patent Document 3] Papanese Patent No. 3827334
[Patent Document 4] Papanese Patent No. 3632524
[Patent Document 5] Japanese Patent Laid-Open Publication No. 2003-055759
[Patent Document 6] Japanese Patent Laid-Open Publication No. 2003-160861

As described above, the conventional technology which uses a sintered compact having a composition of adding zinc to indium oxide as the target is insufficient as a solution since it has drawbacks such as high film resistivity.

Moreover, the patent documents and the like that are similar to the present invention in certain respects as a matter of form such as including descriptions of adding magnesium to ITO do not give consideration to the problems indicated by the present invention, and simply aim to achieve the high resistivity of the film, the amorphous stability of the film, and the high densification of the target by adding magnesium. Thus, the foregoing patent documents and the like do not include the technical concept of controlling the crystallinity of the film or leveraging the low resistivity of the crystallized film as with the present invention.

In addition, if the effect of high resistivity is to be sought based on the concentration of the added magnesium and the like, the additive amount is too high, and, if the effect of high densification of the target is to be sought, the descriptions are limited to those concerning the characteristics of the target, and there are no descriptions on favorable film characteristics of the present invention or descriptions in the Examples regarding the production method and the like.

SUMMARY OF THE INVENTION

Thus, an object of the present invention is to provide an ITO thin film, its production method, and a sintered compact for producing such a film for use as a display electrode or the like in a flat panel display which can be made into an amorphous ITO film by way of sputter deposition without heating the substrate or adding water during deposition. With this film, a part of the crystallized film will not remain as residue during the etching process, and superior etching properties are yielded by etching at a relatively fast etching rate. In addition, this film can be crystallized by annealing at a temperature that is not too high, and the resistivity after crystallization is sufficiently low.

As a result of intense study regarding an oxide target obtained by adding various elements to ITO, the present inventors discovered that the foregoing problems can be overcome by sputtering a sintered compact obtained by adding an adequate concentration of magnesium to ITO under prescribed conditions, and annealing the obtained film under prescribed conditions, and thereby achieved the present invention.

Specifically, the present invention provides:
1) An amorphous film of composite oxide comprised substantially of indium, tin, magnesium and oxygen, and containing tin at a ratio of 5 to 15% based on an atomicity ratio of Sn/(In+Sn+Mg) and magnesium at a ratio of 0.1 to 2.0% based on an atomicity ratio of Mg/(In+Sn+Mg) with remnant being indium and oxygen.

With the present invention, magnesium is additionally contained as an essential component in the ITO composite oxide film. The inclusion of magnesium plays an important role in maintaining the amorphous state of the ITO composite oxide film.

The present invention additionally provides:
2) A crystalline film of composite oxide comprised substantially of indium, tin, magnesium and oxygen, and containing tin at a ratio of 5 to 15% based on an atomicity ratio of Sn/(In+Sn+Mg) and magnesium at a ratio of 0.1 to 2.0% based on an atomicity ratio of Mg/(In+Sn+Mg) with remnant being indium and oxygen, and having a film resistivity of 0.4 mΩcm or less.

This crystalline film of composite oxide has the same composition as the amorphous film of composite oxide of paragraph 1) above, but a film having considerably lower resistivity can be formed.

The present invention further provides:
3) A method of producing a crystalline film of composite oxide, including the steps of producing an amorphous film of ITO composite oxide comprised substantially of indium, tin, magnesium and oxygen, and containing tin at a ratio of 5 to 15% based on an atomicity ratio of Sn/(In+Sn+Mg) and magnesium at a ratio of 0.1 to 2.0% based on an atomicity ratio of Mg/(In+Sn+Mg) with remnant being indium and oxygen, and thereafter crystallizing the ITO composite oxide film by annealing at a temperature of 260° C. or lower.

With the present invention, the amorphous film of composite oxide formed on a substrate can be easily transformed into a crystalline film of composite oxide by annealing at a relatively low temperature. This is one of the significant features of the present invention.

4) Consequently, the film resistivity of the foregoing film after crystallization will be 0.4 mΩcm or less.

The present invention further provides:

5) A method of producing an amorphous film of composite oxide, including the steps of sputtering a sintered compact comprised substantially of indium, tin, magnesium and oxygen, and containing tin at a ratio of 5 to 15% based on an atomicity ratio of Sn/(In+Sn+Mg) and magnesium at a ratio of 0.1 to 2.0% based on an atomicity ratio of Mg/(In+Sn+Mg) with remnant being indium and oxygen, and thereby producing an amorphous film having the same composition.

When forming an amorphous film of composite oxide for use as a transparent conductive film, sputtering is an extremely efficient method. In this respect, it is desirable to produce a sintered compact having the same component composition as the amorphous film of composite oxide, and sputter such sintered compact without changing its characteristics.

The present invention further provides:

6) A method of producing a crystalline film of composite oxide, wherein, after producing the amorphous film according to paragraph 5) above, the amorphous film is crystallized by annealing the film at a temperature of 260° C. or lower.

7) Consequently, the film resistivity of the foregoing film after crystallization will be 0.4 mΩcm or less.

8) The present invention additionally provides a sintered compact of composite oxide for producing the film according to any one of paragraphs 1) to 3) above comprised substantially of indium, tin, magnesium and oxygen, and containing tin at a ratio of 5 to 15% based on an atomicity ratio of Sn/(In+Sn+Mg) and magnesium at a ratio of 0.1 to 2.0% based on an atomicity ratio of Mg/(In+Sn+Mg) with remnant being indium and oxygen.

The first feature of the present invention is that the added magnesium prevents crystallization based on the effect of disconnecting the ITO network structure coupling. If the aim is simply prevention of the crystallization of the ITO film, such aim can be achieved by making the additive concentration to be extremely high.

Nevertheless, in the foregoing case, it is not possible to yield the second feature of the present invention of crystallizing the film by annealing at a temperature that is not too high after deposition, and achieving low resistivity of the crystallized film. This is because if the additive element concentration is made high, the resistivity of the crystallized film will also increase according to increase of crystallization temperature.

In other words, the characteristic feature of the present invention lies in that it is possible to realize both the amorphization of the film during deposition, and achievement of crystallization and low resistivity of the film in the subsequent annealing at an adequate temperature, and the present invention has a novel technical concept that is able to overcome the foregoing problems for the first time.

According to the present invention, by using a sputtering target obtained by adding an adequate concentration of magnesium to ITO in sputter deposition under prescribed conditions without adding water during deposition or heating the substrate, it is possible to obtain a film which is entirely amorphous. Moreover, this film is able to enjoy the advantages of an ITO amorphous film which will not encounter any problem of etching residue in the subsequent etching process, and the etching rate is faster by roughly double digits in comparison to a crystalline ITO film. In addition, it is able to yield an extremely superior effect of enjoying the advantage of crystallizing the film by annealing at a temperature that is not too high after deposition and attaining lower resistivity of the film.

DETAILED DESCRIPTION OF THE INVENTION

The amorphous film of composite oxide, crystalline film of composite oxide, method of producing an amorphous film of composite oxide, method of producing a crystalline film of composite oxide and sintered compact of composite oxide of the present invention are now explained in further detail.

The oxide sintered compact of the present invention that is useful in forming a transparent conductive film is comprised substantially of indium, tin, magnesium and oxygen, and containing tin at a ratio of 5 to 15% based on an atomicity ratio of Sn/(In+Sn+Mg) and magnesium at a ratio of 0.1 to 2.0% based on an atomicity ratio of Mg/(In+Sn+Mg) with remnant being indium and oxygen.

Here, Sn, In and Mg represents the atomicity of tin, indium and magnesium, respectively, and shown is the adequate concentration range of the atomicity ratio of tin and magnesium in relation to the total atomicity of indium, tin and magnesium as all-metal atoms, respectively. The composition of the sputtering target for forming the transparent conductive film and the composition of the transparent conductive film are substantially the same as the composition of the oxide sintered compact for forming the transparent conductive film.

The sputtering target was obtained by simply processing the oxide sintered compact into a prescribed diameter and thickness, and the transparent conductive film is a film obtained by subjecting the sputtering target to sputter deposition. Thus, there is hardly any difference in the composition of the sputtering target and the composition of the film obtained by way of sputter deposition.

Moreover, the term "substantially" means that, although the constituent elements of the sintered compact of composite oxide for forming the transparent conductive film are comprised only from four types of elements; namely, indium, tin, magnesium, and oxygen, even if inevitable impurities contained in a commercially available raw material and which cannot be eliminated with a standard refining method during the production of such raw material are included in an inevitable concentration range, the present invention covers all aspects including the above. In other words, inevitable impurities are covered by the present invention.

When tin is added to indium oxide, it functions as an n-type donor and yields the effect of lowering the resistivity. With a commercially available ITO target and the like, the tin concentration Sn is normally Sn/(In+Sn) is roughly 10%. If the tin concentration is too low, the electron donation will be low. Contrarily, if the tin concentration is too high, this will result in electron scattered impurities. In both cases, the resistivity of the film obtained by sputtering will become high. Accordingly, since the adequate range of tin concentration Sn as an ITO is in a range of 5 to 15% with the formula of Sn/(In+Sn+Ca), the tin concentration in the present invention is defined accordingly.

When magnesium is added to ITO, it yields the effect of preventing the crystallization of the film and amorphizing the film. If the magnesium concentration Mg is Mg/(In+Sn+Mg) <0.1%, there will hardly be any effect of amorphizing the film, and a part of the sputtered film will become crystallized.

Contrarily, in case of Mg/(In+Sn+Mg)>2.0%, the annealing temperature required to crystallize the amorphous film obtained by sputtering will become a high temperature exceeding 260° C., which is unsuitable in terms of productivity since cost, time and labor will be required for implementing such process. Moreover, if the magnesium concentration is too high, even if the film is crystallized by annealing it at a high temperature, the resistivity of the obtained film will be high, and this will be a significant drawback from the perspective of conductivity of the transparent conductive film.

Thus, the magnesium concentration is desirably in the ratio of 0.1 to 2.0% based on the atom ratio of Mg/(In+Sn+Mg) as defined in the present invention. The magnesium concentration was determined as described above.

The method of producing the oxide sintered compact is now explained.

In order to produce the oxide sintered compact of the present invention, firstly, indium oxide powder, tin oxide powder and magnesium oxide powder as the raw materials are weighed and mixed at a prescribed ratio. Insufficient mixing will cause a high resistivity area and a low resistivity area in the produced target where magnesium oxide is segregated and abnormal discharge such as arcing due to electrification in the high resistivity area will occur easily during the sputter deposition.

Thus, it is desirable to mix sufficiently for roughly 2 to 5 minutes at a high speed of 2000 to 4000 rotations per minute using a super mixer. Incidentally, since the raw material powder is oxide, the atmospheric gas may be air since there is no need to pay any attention to prevent the oxidation of the raw material.

At this stage, it is also effective to introduce a calcination process of retaining the raw material in an atmospheric environment at 1250 to 1350° C. for 4 to 6 hours in order to promote the raw material in becoming a solid solution. Further, the raw material may also be preliminarily calcinated as a mixed powder of indium oxide and magnesium oxide or a mixed powder of tin oxide and magnesium oxide.

The mixed powder is subsequently pulverized, of which aim is to uniformly distribute the raw material powder in the target. Raw material with a large grain size means that there is variation in the composition depending on the location. In particular, since magnesium oxide is nonconductive, it will cause an abnormal discharge during the sputter deposition. Moreover, this will also lead to variation in the crystallization prevention effect yielded by magnesium, and may cause the crystallization of the ITO in areas with low magnesium concentration.

Accordingly, desirably pulverization is performed so that the average grain size (D50) of the raw material powder is up to 1 µm or less, preferably 0.6 µm or less. In practice, water is added to the mixed powder to obtain slurry in that the solid content is 40 to 60%, and pulverization is performed with zirconia beads having a diameter of 1 mm for roughly 1.5 to 3.0 hours.

Granulation of the mixed powder is subsequently performed. This object is to improve fluidity raw material powder and make the filling state thereof sufficiently favorable during the press molding. PVA (polyvinyl alcohol) that acts as a binder is mixed at a ratio of 100 to 200 cc per kilogram of slurry, and this is granulated under the conditions where the granulator's inlet temperature is 200 to 250° C., outlet temperature is 100 to 150° C., and disk rotation is 8000 to 10000 rpm.

Press molding is subsequently performed. Granulated powder is filled in a mold of a prescribed size to obtain a compact at a surface pressure of 700 to 900 kgf/cm$^2$. If the surface pressure is 700 kgf/cm$^2$ or less, it is not possible to obtain a compact having sufficient density. And it is not necessary to make the surface pressure to be 900 kgf/cm$^2$ or higher, which is undesirable since it will waste much cost and energy.

Sintering is ultimately performed. The sintering temperature is 1450 to 1600° C., the retention time is 4 to 10 hours, the rate of temperature increase is 4 to 6° C. per minute, and cooling is performed with furnace cooling. If the sintering temperature is lower than 1450° C., the density of the sintered compact will be insufficient, if it exceeds 1600° C., it will shorten the life of the furnace heater.

If the retention time is shorter than 4 hours, the reaction among the raw material powders will not advance sufficiently, and the density of the sintered compact will be insufficient. Even if the sintering time exceeds 10 hours, since the reaction is already sufficient, this is undesirable from the perspective of productivity since energy and time will be wasted.

If the rate of temperature increase is less than 4° C. per minute, much time will be required in attaining a prescribed temperature. Meanwhile, if the rate of temperature increase is greater than 6° C./minute, the temperature distribution within the furnace will not rise uniformly, and there will be unevenness. The relative density of the sintered compact obtained as described above will be approximately 99.9% and the bulk resistance will be approximately 0.13 mΩcm.

The method of producing the sputtering target is explained below.

As a result of performing cylindrical grinding to the outer periphery and surface grinding to the surface side of the oxide sintered compact obtained based on the foregoing manufacturing conditions, the oxide sintered compact can be processed into a size having a thickness of roughly 4 to 6 mm and a diameter to fit the sputtering device, and a sputtering target can be obtained by affixing the oxide sintered compact to a copper backing plate with a bonding metal such as indium alloy or the like.

The sputtering deposition method is explained below.

The transparent conductive film of the present invention formed from ITO composite oxide can be obtained by using the sputtering target of the present invention to perform DC magnetron sputter deposition with an argon gas pressure of 0.4 to 0.8 Pa, spacing between the target and the substrate at 50 to 110 mm, using glass or the like as the substrate without heating the substrate, and a sputtering power of 200 to 900 W in a case where the target size is 8 inches.

If the substrate spacing is shorter than 50 mm, the kinetic energy of the particles of the constituent elements of the target that reach the substrate will become too large and cause substantial damage to the substrate, whereby the film resistivity will increase and a part of the film may become crystallized. Meanwhile, if the spacing between the target and the substrate is longer than 110 mm, the kinetic energy of the particles of the constituent elements of the target that reach the substrate will become too small, whereby a dense film cannot be formed and the resistivity will become high.

The adequate range of the argon gas pressure and the sputtering power has also been defined as described above for similar reasons. Moreover, if the substrate is heated, the film tends to crystallize easily. Thus, the obtained film will become amorphous by adequately selecting the foregoing sputtering conditions.

The method of evaluating the characteristics of the film is now explained.

The determination of crystallinity of the transparent conductive film obtained as described above can be confirmed based on the existence of a peak shown with a crystalline film and whether there is etching residue as shown with a crystalline film in the etching of the film with oxalic acid in the X-ray diffraction measurement (XRD measurement) of the film. In other words, if there is no peak that is unique to ITO crystals and there is no etching residue in the X-ray diffraction measurement, then that film can be determined to be amorphous.

The etching method of the film using oxalic acid can be performed, for instance, by using a solution obtained by mixing oxalic acid dihydrate $(COOH)_2.2H_2O$ and purified water at a ratio of oxalic acid:purified water=5:95 wt % as the etchant, placing this in a constant temperature bath so as to maintain the liquid temperature at 40° C., and stirring the film-attached substrate.

The resistivity of the film can be sought with the Hall effect measurement.

The annealing method of the film is now explained.

In order to crystallize the amorphous film obtained as described above, for example, crystallization can be achieved by annealing at a temperature of 160 to 260° C. for 30 to 60 minutes under a nitrogen atmosphere, whereby the temperature and length will vary slightly depending on the additive element. The crystallization of the film can be confirmed from the peak intensity becoming extremely strong in the XRD measurement or from the etching rate in the etching of the film using oxalic acid decreasing by roughly double digits in comparison to the amorphous film.

In addition, the crystallized film is able to realize low resistivity of $4 \times 10^{-4}$ mΩcm or lower since the electron ejection effect based on tin will be sufficient and both the carrier concentration and mobility will increase, whereby this will vary slightly depending on the additive element concentration.

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1

Indium oxide powder, tin oxide powder and magnesium oxide powder as the raw materials were weighed to achieve In:Sn:Mg=90.78:9.08:0.14% based on the atomicity ratio, and mixed with a super mixer in an atmospheric environment for 3 minutes at 3000 rotations per minute.

Subsequently, water was added to the mixed powder to obtain slurry in that the solid content is 50%, and the slurry was pulverized with zirconia beads having a diameter of 1 mm for 2 hours to achieve an average grain size (D50) of the mixed powder of 0.6 μm or less. PVA (polyvinyl alcohol) was thereafter mixed at a ratio of 125 cc per kilogram of slurry, and granulated under the conditions where the granulator's inlet temperature was 220° C., outlet temperature was 120° C., and disk rotation was 9000 rpm.

Subsequently, granulated powder was filled in a mold of a prescribed size to obtain a target having an 8-inch diameter, and pressed at a surface pressure of 780 kgf/cm² to obtain a compact. The compact was heated up to 1540° C. at a rate of temperature increase of 5° C./minute, retained for 5 hours at 1540° C., and cooled in the form of sintering using furnace cooling.

By performing cylindrical grinding to the outer periphery and surface grinding to the surface side of the oxide sintered compact obtained based on the foregoing manufacturing conditions to realize a thickness of roughly 5 mm and a diameter of 8 inches, and a sputtering target was obtained by affixing the oxide sintered compact to a copper backing plate with a bonding metal such as indium alloy.

The foregoing sputtering target was used to perform DC magnetron sputter deposition with an argon gas pressure of 0.5 Pa, spacing between the target and the substrate at 80 mm, using non-alkali glass as the substrate, and, with the substrate in a non-heated state, and sputtering power of 785 W and deposition time of 22 seconds in order to obtain a film having a film thickness of approximately 550 Å.

As a result of conducting XRD measurement of the foregoing film, a peak showing crystallinity could not be acknowledged. The XRD measurement results of the film are in FIG. 1. Moreover, etching was performed by using a solution obtained by mixing oxalic acid and purified water at a ratio of oxalic acid:purified water=5:95 wt % as the etchant, but no etching residue was acknowledged. The electron micrograph of the film surface midway during the etching is shown in FIG. 2. Based on the results of the two types of evaluations for determining the film characteristics, the obtained film has been determined as amorphous.

Figure 3:
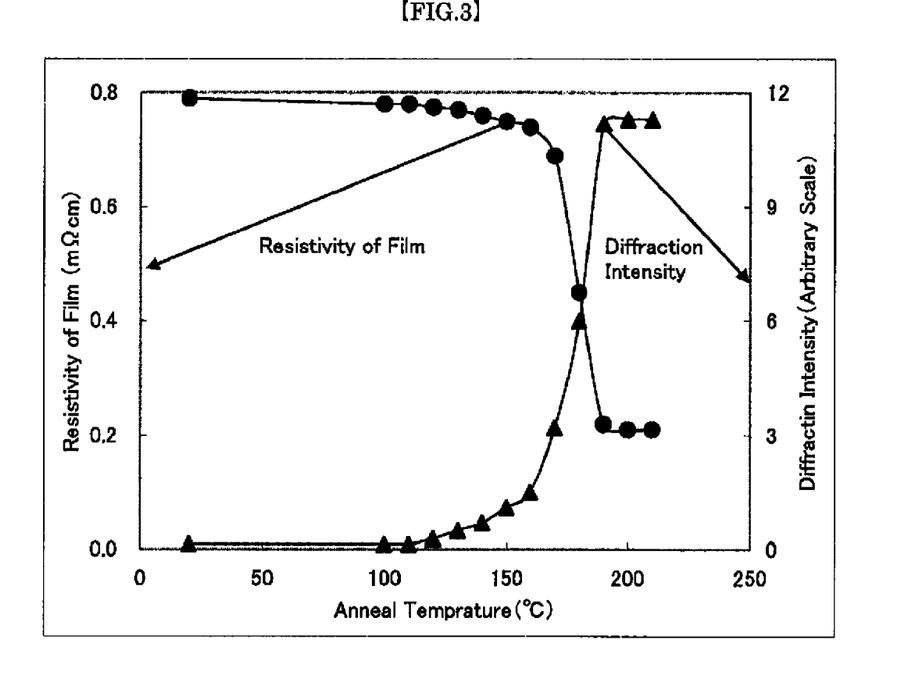
FIG. 3 is a graph showing the correlation of the anneal temperature, film resistivity and peak intensity in the XRD measurement of the sputtered film in Example 1.

The foregoing amorphous film was annealed under a nitrogen atmosphere at the respective temperatures of 100 to 210° C. for 60 minutes in 10° C. intervals, and the XRD measurement, resistivity, and transmission factor of the annealed film were measured. The correlation of the peak intensity based on the annealing temperature and XRD measurement and the film resistivity is shown in FIG. 3.

Pursuant to the increase in the annealing temperature, the peak intensity in the XRD measurement gradually becomes larger, but the peak intensity suddenly increases from a certain temperature, and subsequently becomes stable. Moreover, pursuant to the increase in the annealing temperature, the film resistivity decreases, but the film resistivity suddenly decreases from a certain temperature, and subsequently becomes stable.

Both of the foregoing temperatures are roughly the same, and the temperature in that the peak intensity and resistivity start to stabilize was determined to be the crystallization temperature of the film. Since there is slight variance in determining whether the peak intensity and resistivity have stabilized in determining the crystallization temperature, variance of roughly 5° C. will arise. However, there is no need to strictly determine this value, and it will suffice to comprehend the tendency in relation to the additive concentration.

Figure 1:
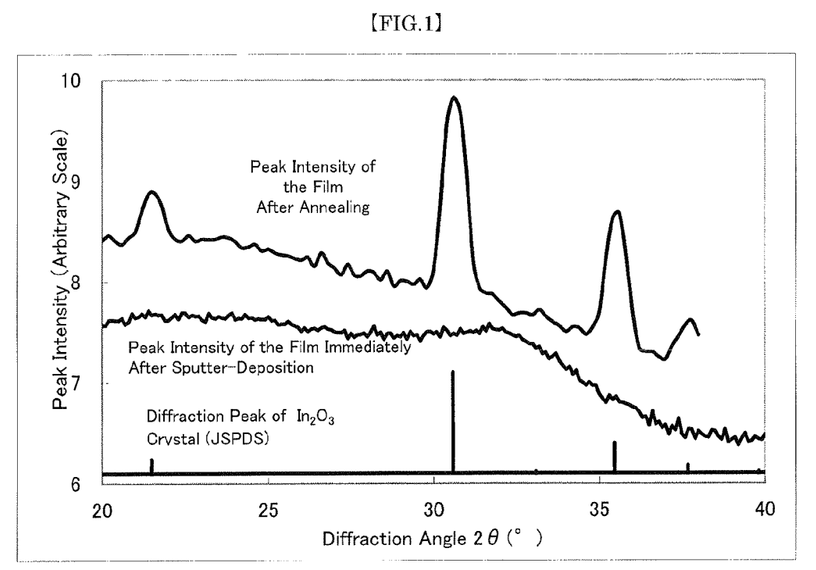
FIG. 1 is a graph showing the XRD diffraction measurement results of the sputtered film in Example 1.
Figure 2:
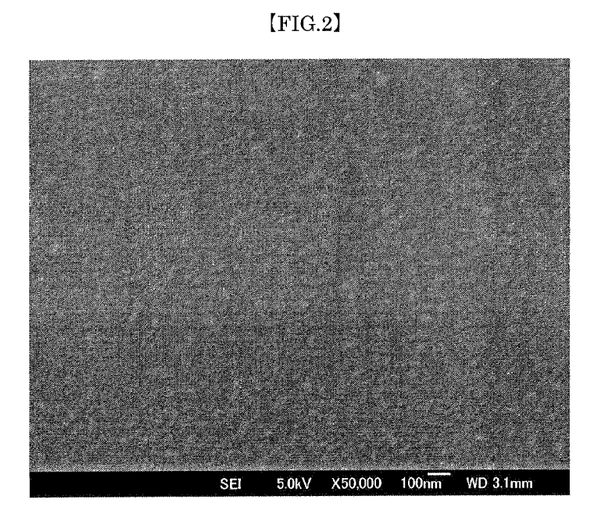
FIG. 2 is a diagram showing an electron micrograph of the film surface midway during the etching of the sputtered film in Example 1.

The XRD measurement results of the crystallized film are shown in FIG. 1. The crystallization temperature of this film was 189° C., and the resistivity of the crystallized film was 0.22 mΩcm. These results are shown in Table 1. Moreover, the transmission factor at a wavelength of 550 nm was 90%.

TABLE 1

| | Sintered Compact Composition (Atomicity Ratio %) | | | | Crystallinity During Deposition | Crystallization Temperature (° C.) | Resistivity after Crystallization (mΩcm) |
|---|---|---|---|---|---|---|---|
| | In | Sn | Mg | Zn | | | |
| Example 1 | 90.78 | 9.08 | 0.14 | 0.00 | Amorphous | 189 | 0.22 |
| Example 2 | 90.66 | 9.07 | 0.27 | 0.00 | Amorphous | 200 | 0.26 |
| Example 3 | 90.41 | 9.04 | 0.55 | 0.00 | Amorphous | 218 | 0.29 |
| Example 4 | 89.91 | 8.99 | 1.10 | 0.00 | Amorphous | 235 | 0.33 |
| Example 5 | 89.41 | 8.94 | 1.65 | 0.00 | Amorphous | 250 | 0.37 |
| Example 6 | 89.09 | 8.91 | 2.00 | 0.00 | Amorphous | 255 | 0.39 |
| Comparative Example 1 | 90.00 | 10.00 | 0.00 | 0.00 | Crystalline | 150 | 0.18 |
| Comparative Example 2 | 90.00 | 0.00 | 0.00 | 10.00 | Amorphous | 600 | 2.42 |
| Comparative Example 3 | 90.85 | 9.08 | 0.07 | 0.00 | Crystalline | 170 | 0.20 |
| Comparative Example 4 | 88.64 | 8.86 | 2.50 | 0.00 | Amorphous | 270 | 0.47 |

Examples 2 to 6

The sintered compact composition of Example 1 was changed as follows in Examples 2 to 6, whereby the other conditions are the same as Example 1.

The atomicity ratio % of the sintered compact composition in Example 2, Example 3, Example 4, Example 5 and Example 6 was changed to In:Sn:Mg=90.66:9.07:0.27, In:Sn:Mg=90.41:9.04:0.55, In:Sn:Mg=89.91:8.99:1.10, In:Sn:Mg=89.41:8.94:1.65, and In:Sn:Mg=89.09:8.91:2.00, respectively. The crystallinity during deposition, the crystallization temperature, and the resistivity of the crystallized film were shown in Table 1, respectively.

From the foregoing results, the crystallinity of the deposited film was amorphous in all of the Examples, and, although the crystallization temperature gradually increases to a higher temperature pursuant to the increase in the magnesium additive concentration, as evident from the results of Example 6, the crystallization temperature was 255° C., which is not too high. Moreover, although the resistivity of the crystallized film gradually increases pursuant to the increase in the magnesium additive concentration, as evident from the results of Example 6, the resistivity was 0.39 mΩcm, and this value remained smaller than 0.45 mΩcm, which is the resistivity of the amorphous film in that zinc was added to indium oxide in the case of Comparative Example 2 described later.

Comparative Examples 1 and 2

Comparative Examples 1 and 2, as a sintered compact, a composition obtained by not adding magnesium to the sintered compact of Example 1 and adding tin to indium oxide or zinc to indium oxide, whereby the other conditions are the same as those of Example 1.

The atomicity ratio % of the sintered compact composition in Comparative Example 1 and Comparative Example 2 is In:Sn=90.00:10.00, In:Zn=90.00:10.00, respectively. The crystallinity during deposition, the crystallization temperature, and the resistivity of the crystallized film were shown in Table 1, respectively.

Figure 4:
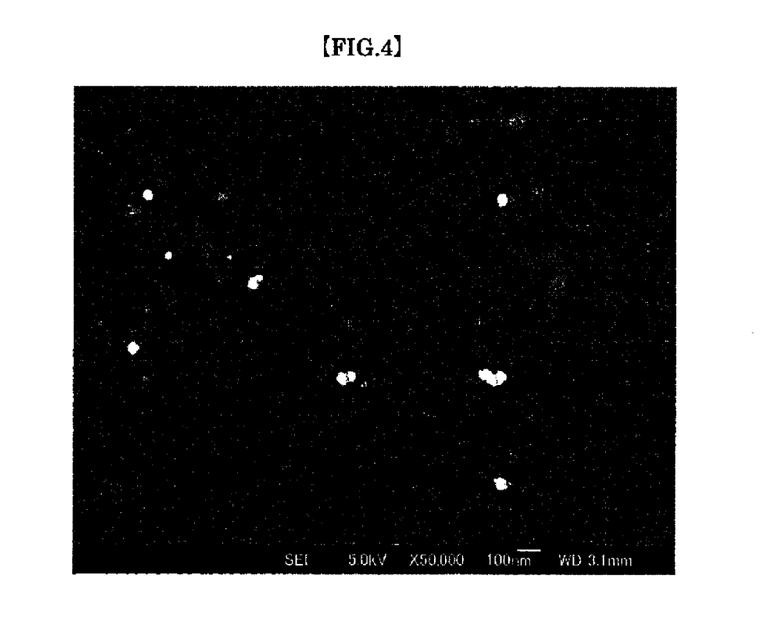
FIG. 4 is a diagram showing an electron micrograph of the film surface midway during the etching of the sputtered film in Comparative Example 1.

Moreover, the electron micrograph of the film surface during the etching of the film of Comparative Example 1 is shown in FIG. 4. A portion of the film crystallized as etching residue can be observed.

From the foregoing results, although the crystallization temperature is low and the resistivity of the crystallized film is small in Comparative Example 1, the film quality became crystallized during the deposition, which is a problem in that this will remain as etching residue.

Meanwhile, with Comparative Example 2, the quality of the deposited film was amorphous and the film resistivity was 0.45 mΩcm. Since the film was extremely stable as an amorphous material, the crystallization temperature resulted in an extremely high at 600° C., and the resistivity of the crystallized film was extremely high at 2.42 mΩcm.

Comparative Example 3 and 4

In comparative Examples 3 and 4, the sintered compact composition of Example 1 was changed as follows, whereby the other conditions are the same as those of Example 1. The atomicity ratio % of the sintered compact composition in Comparative Example 3 and Comparative Example 4 was changed to In:Sn:Mg=90.85:9.08:0.07, and In:Sn:Mg=88.64:8.86:2.50, respectively. Comparative Example 3 has a low magnesium additive concentration but Comparative Example 4 has a high magnesium additive concentration. The crystallinity during deposition, the crystallization temperature, and the resistivity of the crystallized film were as shown in Table 1, respectively.

From the foregoing results, the crystallization temperature is low and the resistivity of the crystallized film is small in Comparative Example 3, but the film quality became crystallized during the deposition, which is a problem in that this will remain as etching residue.

Meanwhile, with Comparative Example 4, the quality of the deposited film was amorphous, the crystallization temperature exceeded 260° C., which is high, and the resistivity of the crystallized film was high at 0.47 mΩcm. Since this value is substantially the same as the resistivity of the film before annealing that is obtained by adding zinc to indium oxide in the case of Comparative Example 2 described above, there is no particular advantage from the perspective of resistivity.

As explained above, according to the present invention, it is possible to obtain an ITO film in that the entire film is amorphous by subjecting the target to sputter deposition without adding water. In addition, the present invention is extremely useful as a transparent conductor with respect to the point that the film will subsequently crystallize by annealing at a temperature that is not too high, the etching rate of the film will decrease, and the resistivity of the film will become low.

The invention claimed is:

1. A sintered compact for producing an amorphous film having a composite oxide composition, comprising:
    a sintered compact consisting of indium, tin, magnesium and oxygen, wherein tin is contained at a ratio of 5 to 15% based on an atomicity ratio of Sn/(In+Sn+Mg) and magnesium is contained at a ratio of 0.1 to 2.0% based on an atomicity ratio of Mg/(In+Sn+Mg) with remnant being indium and oxygen;
    said sintered compact having a relative density of 99.9% and a bulk resistance of 0.13 mΩcm.

2. A method of producing a film having a composite oxide composition, comprising the steps of:
    performing sputtering to a sintered compact consisting of indium, tin, magnesium and oxygen, wherein tin is contained at a ratio of 5 to 15% based on an atomicity ratio of Sn/(In+Sn+Mg) and magnesium is contained at a ratio of 0.1 to 2.0% based on an atomicity ratio of Mg/(In+Sn+Mg) with remnant being indium and oxygen, the sintered compact having a relative density of 99.9% and a bulk resistance of 0.13 mΩcm, and wherein, during said sputtering, an amorphous film of composite oxide having the same composition as the sintered compact is produced; and
    subjecting the amorphous film of having the composite oxide composition to microfabrication treatment.

3. A method according to claim 2, wherein said microfabrication treatment is etching.

4. A method according to claim 2, further comprising the step of:
    crystallizing the amorphous film by annealing the amorphous film at a temperature of 260° C. or lower.

5. A method according to claim 4, wherein, during said crystallizing step, the resistivity of the crystallized film is made to be 0.4 mΩcm or less.

* * * * *